(12) United States Patent
Yajima et al.

(10) Patent No.: US 7,029,013 B2
(45) Date of Patent: Apr. 18, 2006

(54) SEAL MEMBER, AND SUBSTRATE STORAGE CONTAINER USING THE SAME

(75) Inventors: Toshitsugu Yajima, Niigata (JP); Toshiyuki Kamada, Saitama (JP)

(73) Assignees: Shin-Etsu Polymer Co., Ltd., (JP); Shin-Etsu Handotai Co. Ltd., (JP)

( * ) Notice: Subject to any disclaimer, the term of this patent is extended or adjusted under 35 U.S.C. 154(b) by 0 days.

(21) Appl. No.: 10/204,295

(22) PCT Filed: Dec. 7, 2001

(86) PCT No.: PCT/JP01/10732

§ 371 (c)(1), (2), (4) Date: Aug. 20, 2002

(87) PCT Pub. No.: WO02/47154

PCT Pub. Date: Jun. 13, 2002

(65) Prior Publication Data

US 2003/0107187 A1 Jun. 12, 2003

(30) Foreign Application Priority Data

Dec. 7, 2000 (JP) ............................. 2000-372527

(51) Int. Cl.
*F16J 15/02* (2006.01)
*B65D 85/00* (2006.01)

(52) U.S. Cl. ................. 277/637; 277/641; 277/644; 277/651; 206/710

(58) Field of Classification Search ................ 277/630, 277/637, 640, 641, 642, 644, 650, 651; 206/710
See application file for complete search history.

(56) References Cited

U.S. PATENT DOCUMENTS

| | | | | | |
|---|---|---|---|---|---|
| 3,355,057 | A | * | 11/1967 | MacKenzie et al. | 220/378 |
| 3,578,346 | A | * | 5/1971 | Jelinek | 277/611 |
| 4,026,565 | A | * | 5/1977 | Jelinek | 277/639 |
| 4,158,757 | A | * | 6/1979 | Reichert et al. | 200/302.1 |
| 4,345,739 | A | * | 8/1982 | Wheatley | 251/358 |
| 4,575,105 | A | * | 3/1986 | le Pierres | 277/637 |
| 4,597,583 | A | * | 7/1986 | Inciong et al. | 277/591 |
| 4,804,086 | A | * | 2/1989 | Grohrock | 206/710 |
| 4,854,476 | A | * | 8/1989 | Serio, Jr. | 220/4.01 |
| 5,011,162 | A | * | 4/1991 | Jelinek | 277/644 |
| 5,050,764 | A | * | 9/1991 | Voss | 220/378 |
| 5,145,190 | A | * | 9/1992 | Boardman | 277/596 |
| 5,375,569 | A | * | 12/1994 | Santella | 123/90.38 |
| 5,536,018 | A | * | 7/1996 | Szott | 277/313 |
| 5,564,714 | A | * | 10/1996 | Katsuno et al. | 277/630 |

(Continued)

FOREIGN PATENT DOCUMENTS

JP 4-307181 A1 10/1992

(Continued)

*Primary Examiner*—Alison K. Pickard
(74) *Attorney, Agent, or Firm*—Lerner, David, Littenberg, Krumholz & Mentlik, LLP (57) ABSTRACT

A seal member for a substrate storage container disposed between an opening end portion of a container body and a cover, which container body and cover form the container and which container body has the opening end portion and stores substrates, is disclosed. The seal member comprises a base body section formed of a first material and a covering section formed of a second material and covering at least a part of the base body section, wherein the covering section includes a seal forming portion for forming a seal in contact with one of the container body and the cover.

6 Claims, 8 Drawing Sheets

U.S. PATENT DOCUMENTS

| | | | |
|---|---|---|---|
| 5,611,452 A * | 3/1997 | Bonora et al. | 220/378 |
| 5,671,927 A * | 9/1997 | Schweiger | 277/630 |
| 5,687,975 A * | 11/1997 | Inciong | 277/591 |
| 5,794,947 A * | 8/1998 | Shimizu | 277/630 |
| 5,868,397 A * | 2/1999 | Kuboshima et al. | 277/637 |
| 5,971,191 A * | 10/1999 | Yamada et al. | 220/378 |
| 6,354,601 B1 * | 3/2002 | Krampotich et al. | 277/628 |
| 6,364,152 B1 * | 4/2002 | Poslinski et al. | 220/788 |
| 6,406,033 B1 * | 6/2002 | Jessberger | 277/616 |

FOREIGN PATENT DOCUMENTS

| | | |
|---|---|---|
| JP | 8-283698 A1 | 10/1996 |
| JP | 10-189703 A1 | 7/1998 |
| JP | 2000-266187 A1 | 9/2000 |
| JP | 2001-2180 * | 1/2001 |

* cited by examiner

SEAL MEMBER, AND SUBSTRATE STORAGE CONTAINER USING THE SAME

FIELD OF THE INVENTION

The present invention relates to a seal member which is interposed between an opening end portion of a substrate storage container for storing substrates such as semiconductor wafers, mask glass plates or the like and a cover for closing the opening end portion, and a substrate storage container using the same.

BACKGROUND OF THE INVENTION

Conventionally, a seal member used for hermetically closing an opening portion of a substrate storage container with a cover has been formed to have an endless shape using one or some of various thermoplastic elastomers such as polyolefine elastomers and polyester elastomers, or various rubber materials such as fluororubber and EPDM (ethylene propylene diene terpolymer) by means of a mold. The thus obtained seal member for a substrate storage container is used after it has been cleaned so as not to contaminate substrates to be stored.

The conventional seal member has been used in such a manner that a fitting portion provided in the form of a groove or a projection at a peripheral edge of the opening portion of a container body or at a peripheral edge of a cover corresponding to the opening portion and an engaging portion provided in the form of a projection or a groove on the seal member are fitted to each other. Fitting of the seal member has been manually performed.

The conventional seal member is entirely formed of a thermoplastic elastomer or the like which is an elastic material as described above. For this reason, the seal member is easily deformable and its size varies widely depending on molding conditions or the like. In particular, the seal member is prone to stick to the mold after it has been molded, and if it is forcibly peeled off from the mold when it is released from the mold, a circumferential length thereof is further deviated. Furthermore, it is difficult to keep the shape of the seal member accurately during storage after it has been molded. Moreover, the conventional seal members lack size stability, for example, they are easily deformed due to uneven cooling caused by stacking of products or under different loads.

Since the seal member, as described above, is formed of an elastic and non-rigid material and it is required that a recess or projection serving as an engaging portion for engaging the cover or the container body be formed on the seal member, the seal member is more prone to stick to the mold, whereby it is difficult to automate removal of the seal member from the mold, so that the removal of the seal member must be performed manually.

Since the seal member obtained in the above manner is easily deformed even during storage thereof, as described above, the seal member must be handled with the utmost caution so as to prevent the seal member from deforming, resulting in handling thereof during storage or transferring being troublesome.

A seal member is used in a substrate storage container after it has been cleaned with a cleaning liquid such as a surface active agent or the like, or rinsing water such as pure water, ultrapure water or the like, whereby contaminants such as particles or the like on a surface of the seal member are removed from the seal member. In such cleaning, in order to increase productivity, a plurality of seal members are collectively processed. Unfortunately, since the conventional seal members formed of a flexible material having elasticity easily deform into an infinite variety of forms and are unstable, when they are cleaned without any arrangement therefor, a portion of a surface of the seal member is twisted or portions thereof overlap, so that sufficient cleaning can not always be achieved.

For this reason, a method for cleaning has been proposed, wherein a seal member is cleaned while the seal member is held on a frame formed to serve as a retaining member for cleaning so that a slight tension is exerted on the seal member. However, such a slight tension or changes in temperature during cleaning cause the size of the seal member to be unstable.

Furthermore, when the seal member is attached to the container body or the cover of the substrate storage container to be used, the engaging portion of the seal member must be properly fitted-in over its entire periphery, resulting in the attaching operation being very complicated. In particular, in the case of a substrate storage container which stores large diameter substrates such as wafers having a diameter of 200 mm or more, which have become mainstream recently, it is matter of course that the circumference of the opening portion of the container body is large, so that mounting of the seal member has become very troublesome work. However, in order to maintain the cleanliness of the substrate storage container, it is necessary to prevent interposition of a worker as much as possible, and thus it is preferable to handle the seal member by means of an automatic machine.

Also, when the seal member is mounted at a predetermined location on the container body or the cover of the substrate storage container, unless the seal member is properly fitted at at least one portion thereof, there is a possibility of the following undesirable events taking place: a poor sealing occurs; a part of the engaging portion of the seal member comes off from the fitting portion and is partially turned up when the cover is removed; subsequent fitting of the cover can not be performed due to the turned-up part of the seal member; and particles are produced due to rubbing of the seal member against a portion of the container when the seal member is strongly compressed at the turned-up part thereof or the like, to thereby contaminate the substrates to be stored.

Particularly, in recent years, mounting and dismounting of the cover of the substrate storage container has been performed by an automatic machine instead of the conventional work carried out by a person in order to improve cleanliness in a workshop. Accordingly, when there are variations in the circumferences of the seal members, deformation of the seal members, insufficient fitting of the seal member in mounting or the like, there will be troubles, namely, the seal member is bitten without a positional displacement of the seal member being made known, and the opening/closing operation of the cover is interrupted due to the occurrence of a load when the cover is closed, resulting in the problem that productivity has been considerably reduced.

The present invention has been made in order to solve the above problem. Therefore, an object of the present invention is to provide a seal member which varies within a small range in size during molding and has an excellent mold releasability, which is easy to handle during cleaning or storage thereafter and easy to mount to a substrate storage container and allows automation of these operations, which is less contaminated during handling, and which is prevented from being displaced from the engaged position or turned up during use by firmly mounting the seal member to the substrate storage container, and a substrate storage container using such a seal member.

SUMMARY OF THE INVENTION

In accordance with one aspect of the present invention, a seal member is provided, which seal member is interposed between an opening end portion of a substrate storage container and a cover, and which container is comprised of a container body which has the opening end portion and which stores a substrate and the cover. The seal member comprises a base body section formed of a first material and a covering section formed of a second material and covering at least a part of the base body section, wherein the covering section includes a seal forming portion which comes in contact with one of the container body and the cover to form a seal. It is preferable that the first material comprise a thermoplastic resin material and the second material comprise a thermoplastic elastomer. The covering section may be one which covers the entire area of the base body section. Alternatively, the base body section may include a portion which forms a tab projecting from the covering section. Also, the seal member may be formed in such a manner that the covering section is formed on an outer peripheral surface or an inner peripheral surface of the base body section; and the covering section is provided with a curved projecting portion formed at one end thereof, which projecting portion serves as the seal forming portion, and is provided with an engaging portion formed at the other end thereof, which engaging portion is engageable with the other one of the container body and the cover.

In accordance with another aspect of the present invention, a substrate storage container is provided. The substrate storage container comprises a container body which has an opening end portion and stores a substrate and a cover; wherein a seal member is interposed between the opening end portion and the cover; the seal member comprises a base body section which is formed of a first material and a covering section which is formed of a second material and covers at least a part of the base body section; the covering section is provided at one end thereof with a seal forming portion which comes in contact with one of the container body and the cover to form a seal and is provided at the other end thereof with an engaging portion which is engageable with the other one of the container body and the cover; and a fitting portion which retains the engaging portion is formed on the other one of the container body and the cover.

The base body section is formed of the first material which is hard and rigid for maintaining the shape of the seal member, and the covering section is formed of the second material which is elastic and comes in contact with the opening end portion or the cover so as to form a seal, to thereby prevent particles from being generated due to rubbing. The base body section may be a core portion of which the entire surface is substantially covered with the covering section. Alternatively, the base body section may be a frame for the seal member, which frame is exposed except for a part thereof which is covered with the covering section.

DETAILED DESCRIPTION

An embodiment of a seal member according to the present invention and an embodiment of a substrate storage container using the seal member will be described hereinafter with reference to the drawings.

Figure 1:
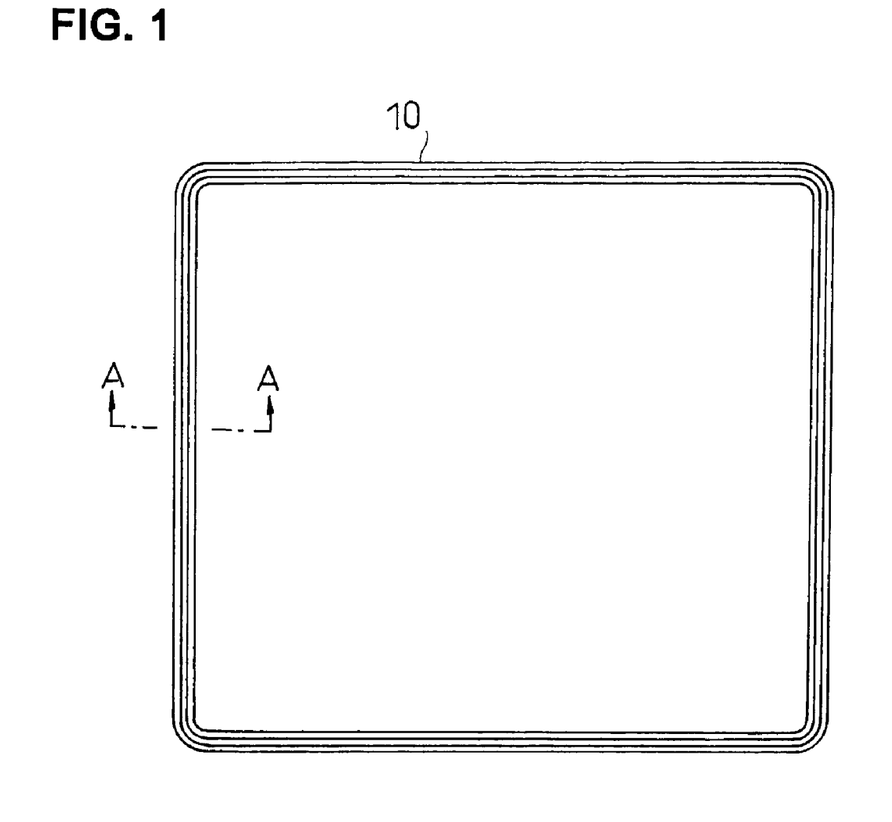
FIG. 1 is a top, elevational view showing a first embodiment of a seal member according to the present invention.
Figure 2:
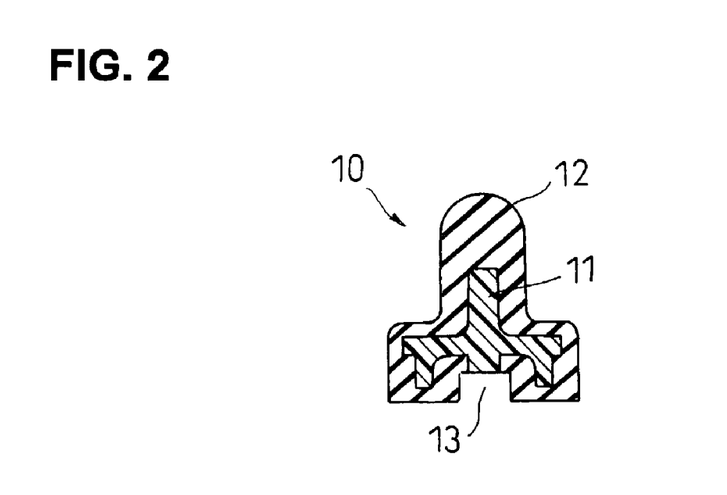
FIG. 2 is a side, elevational, sectional view of the seal member of FIG. 1 taken along line A—A.
Figure 3:
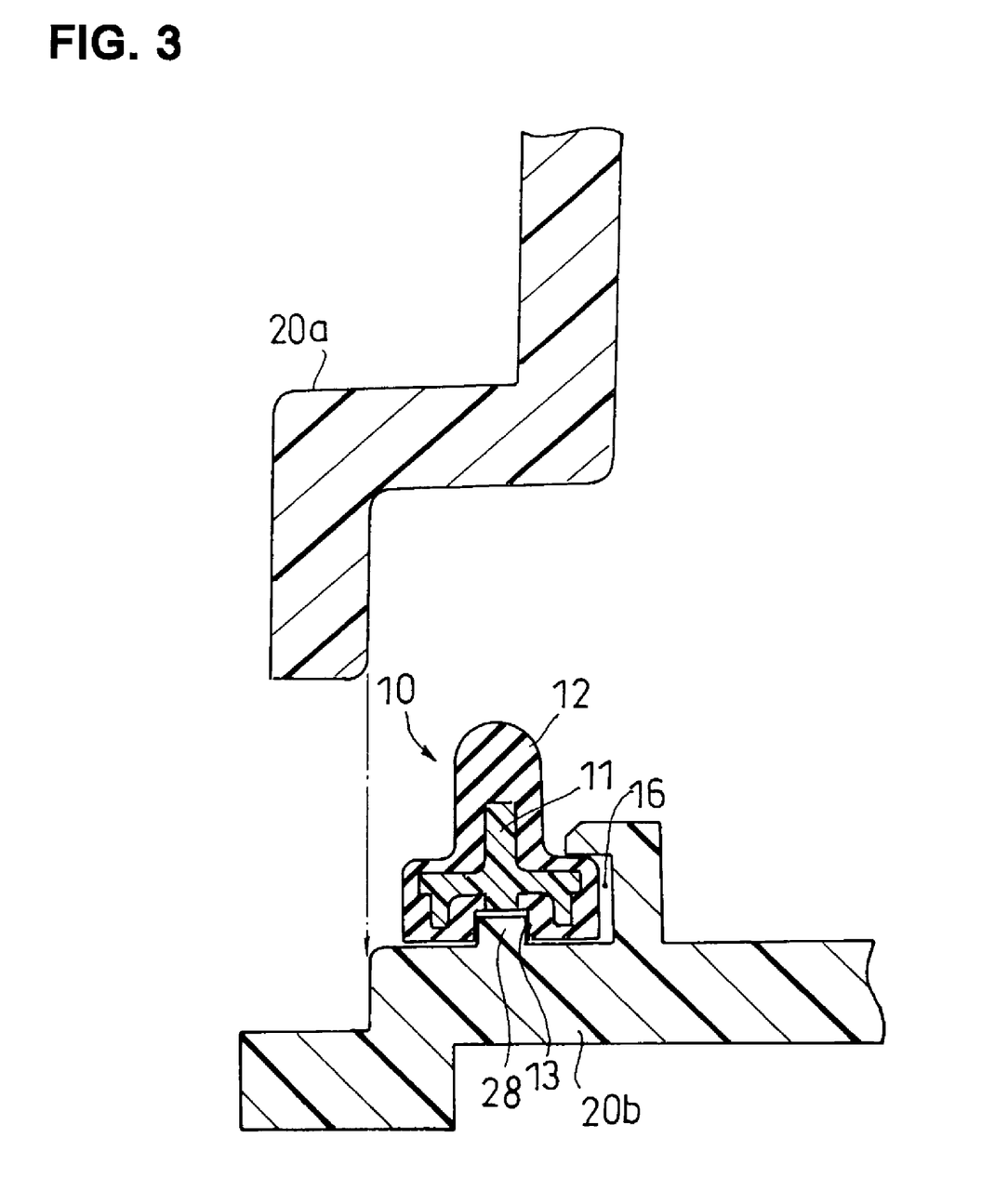
FIG. 3 is a side, elevational, sectional view showing a state of the seal member of FIG. 2 in use.

As shown in FIGS. 1 to 3, a seal member 10 of a first embodiment of the present invention is generally formed to have a rectangular endless shape with rounded corners by forming a base body section 11 serving as a core member of the seal member 10 from a first material or thermoplastic resin material and then forming a covering section 12 from a second material or thermoplastic elastomer so as to cover the base body section, to thereby be integrated therewith.

Figure 4:
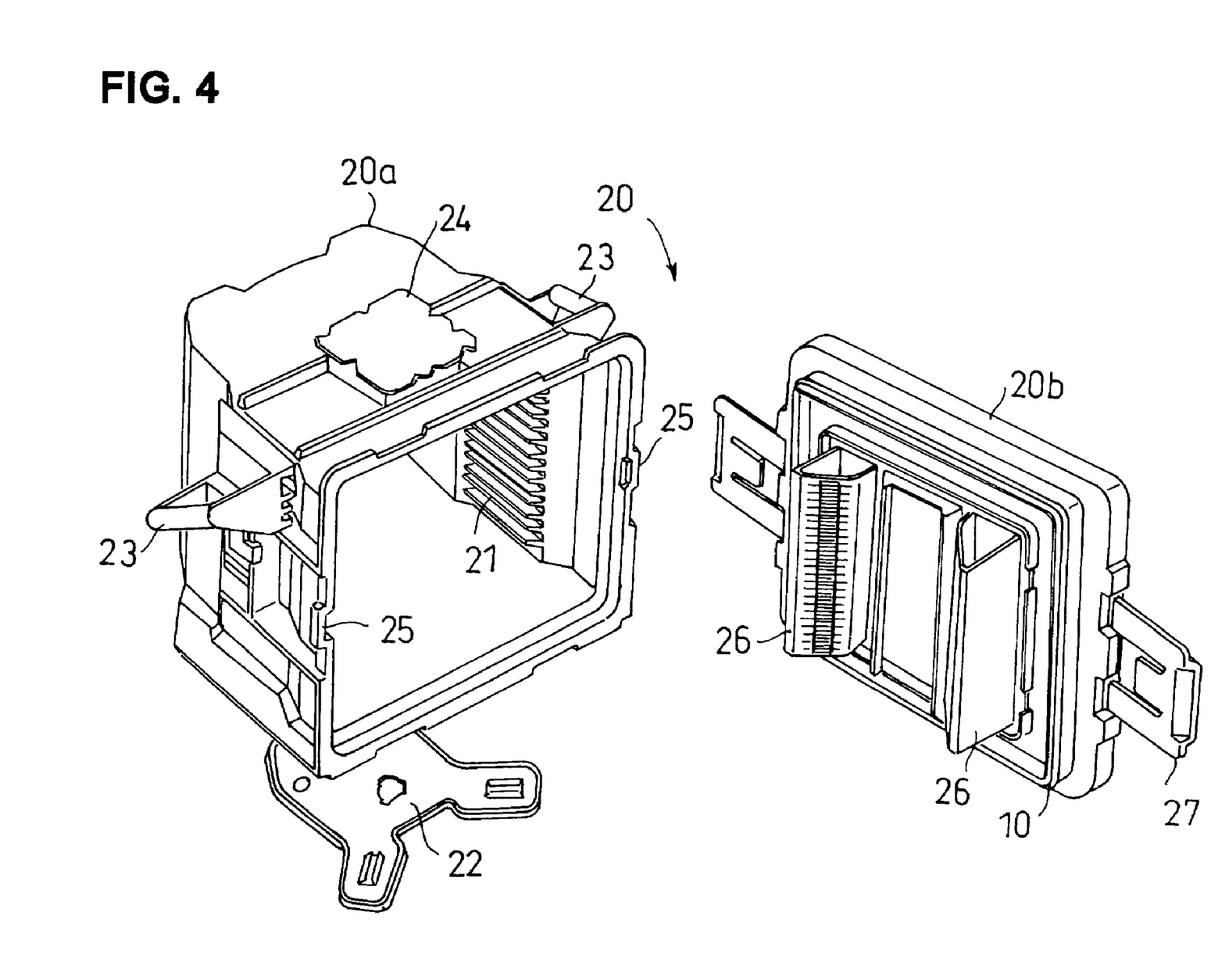
FIG. 4 is a side, exploded, perspective view of a substrate storage container in which the seal member of the embodiment of the present invention is used.

The seal member 10 is used in a substrate storage container 20 shown in FIG. 4. The substrate storage container 20 is constituted by a container body 20a having an opening on its front side and a lid or cover 20b which closes the opening. The container body 20a is provided on opposed inner walls thereof at equal intervals in a vertical direction with supporting shelves 21 which are protruded inwardly in a manner to be opposed to each other so as to support substrates in a horizontal orientation. The container body 20a has a bottom plate 22 for positioning the container body 20a with respect to an apparatus mounted on a bottom thereof. The container body 20a also has handle members 23 for manual conveyance and a robotic flange 24 for automatic conveyance which are respectively mounted on sides and a top thereof, as required. Also, at least one pair of cover engaging portions 25 for engaging the cover 20b are provided at a periphery of the opening of the container body 20a.

The seal member 10 formed in the endless shape is mounted on a side wall of the cover 20b in order to hermetically close the opening along its entire periphery. A pair of retainers 26 formed therein with V grooves which are adapted to abut on respective substrates are mounted on an inner surface of the cover 20b opposing the opening of the container body 20a in a manner to project towards an interior of the container body 20a so that the retainers 26 abut on end portions of the substrates received in the container body 20a. Also, the cover 20b has a pair of engaging members 27 mounted on the opposite sides of the side wall thereof so as to hold the cover 20b on the container body 20a.

The container body 20a and the cover 20b are each formed to be a transparent body or an opaque body using thermoplastic resin such as polycarbonate resin, polybutylene terephthalate resin or the like. Also, the resin may be antistatic or conductive thermoplastic resin in which an antistatic agent or a conductive agent has been added.

In this instance, the shape of the seal member 10 is not particularly limited to a specific one. Instead, the seal member can have any shape corresponding to the opening of the container body 20a, for example, the general shape thereof may be circular or oval. The sectional shape of the seal member 10 is formed in, for example, an inverted T-shape as shown in FIG. 2, where one end thereof is formed in a semicircular shape so as to serve as a seal forming portion adapted to come in elastically deformable contact with the opening end portion of the container body and the other end thereof is formed over its entire periphery with an engaging groove 13 serving as an engaging portion when the seal member is attached to the cover 20b. The cover 20b is provided on the side wall thereof with an engaging projection 28 which serves as a fitting portion with respect to the seal member and which is fitted into the engaging groove 13 of the seal member. Attaching of the seal member 10 is performed by pushing the seal member 10 into a seal member receiving groove 16 provided in the side face of the cover 20b and fitting the engaging groove 13 and the engaging projection 28 to each other. The seal member 10 is not limited to being attached to the cover 20b. Instead, the seal member 10 can be attached to the peripheral edge of the opening of the container body 20a to cause the distal end of the seal member 10 to abut on the cover 20b. The engaging portion may be formed in a projection-like shape instead of the above-described groove shape or hole shape, and the fitting portion may be formed in any shape fittingly engageable with the engaging portion, such as a groove or a hole instead of the above-described projection. The seal member 10 may be formed to have an h-shape, an I-shape or the like in section instead of the inverted T-shape shown in FIG. 2. Also, the base body section 11 may be formed in any shape similar to the general shape of the covering section 12 but in a reduced size insofar as that the compression performance of the covering section 12 is not affected.

The base body section 11 is formed of a rigid first material selected from the group of thermoplastic resin such as polypropylene, polyethylene, polyethylene terephthalate, polycarbonate, polybutylene terephthalate, polystyrene and the like, thermosetting resin such as phenol resin, epoxy resin and the like, metal materials such as iron, stainless steel, aluminum and the like, ceramics and the like. The covering section 12 is formed of a flexible and elastic second material selected from the group of various thermoplastic elastomers such as polyolefine rubber, polyester rubber, polystyrene rubber, polyurethane rubber, fluororubber, and rubber materials such as EPDM, NBR, IR and the like. Taking into account efficiency in integration of two such different kinds of materials, it is preferable that the thermoplastic resin material be selected as the first material and the thermoplastic elastomer be selected as the second material.

In view of the compatibility or adhesiveness of two different materials or the like, it is preferable that, when a thermoplastic polyolefine elastomer (a soft component of which is EPDM or ethylene-propylene-diene terpolymer, and a hard component of which is polypropylene, wherein these components are mixed and a portion or all of the mixture is cross-linked) is selected for the covering section 12 of the seal member 10, polypropylene or polyethylene be selected as the material for the base body section 11, and that when a thermoplastic polyester elastomer (a soft component of which is an aliphatic polyether copolymer or aliphatic polyester and a hard component of which comprises aromatic polyester resin) is selected for the covering section 12, polycarbonate, polyethylene terephthalate or polybutylene terephthalate be selected for the base body section 11.

The seal member 10 can be obtained by first forming the base body section 11 using the above-described thermoplastic resin material, then inserting and holding the obtained base body section 11 in a mold for molding the covering section 12, and thereafter filling a thermoplastic elastomer in the remaining space, to thereby integrate the elastomer with the base body section 11.

During such an operation, it is preferable that the base body section 11 be held in a cavity of the mold utilizing fixed or movable holding pins or the like according to a two-color molding or insert molding technique which has been conventionally known in the art such that the base body section 11 will not move in the mold. Particularly, it is preferable that a movable pin which can be displaced due to resin pressure be used, so that no undesirable recessed portion which is a mark of the holding pin will be left on a surface of the covering section 12 obtained. In place of molding according to the insert molding technique, the covering section 12 of the seal member 10 can be continuously molded by a two color molding machine when the shape of the base body section 11 is specially designed.

Since the seal member 10 thus formed has the base body section 11 over the entire periphery thereof, the seal member 10 is rigid and has a shape retention, so that the seal member 10 is not readily deformed as compared with the seal member made only of an elastic material, and thus it is easy to handle. Such a seal member can also be handled even by an automatic machine when cleaning, storing or attaching the seal member. In attaching the seal member 10 to the substrate storage container 20, the seal member 10 has the base body section 11 so that force transmission is excellent, whereby the seal member can be easily engaged with the engaged portion by pushing the seal member at locations thereof spaced at equal intervals without strongly pushing the seal member over the entire periphery thereof. Also, since the seal member 10 has the base body section 11 and thus it is hard to deform, an engaging force in engagement becomes large to make it difficult for the seal member to come off from the engaged portion, so that the seal member is prevented from being displaced during use. It is preferable that the base body section 11 be not extended into a tip end of the projection provided on the covering section 12, which projection forms a seal between the substrate storage container 20 and the covering section 12, so that the tip end of the projection has sufficient flexibility.

In this instance, a seal member which has a base body section and a covering section like the seal member 10 described above but which has the entire area of the base body section thereof covered with the covering section may be employed.

Referring now to FIGS. 5 to 9, a seal member 30 of a second embodiment of the present invention is illustrated therein. The seal member 30 includes a base body section 31 formed of the first material, for example, a thermoplastic resin material, and a covering section 32 formed of the second material, for example, a thermoplastic elastomer. The base body section 31 is provided thereon with one or a plurality of tabs 34 extending outward through the covering section 32.

Figure 5:
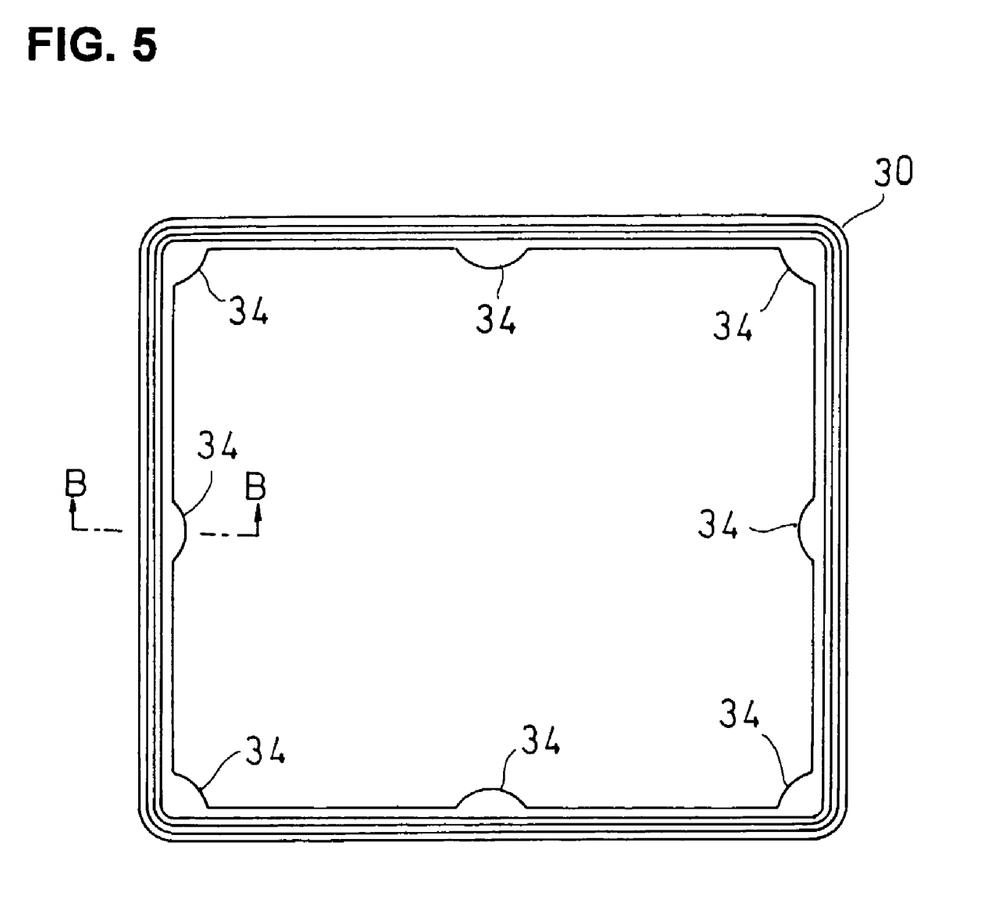
FIG. 5 is a top, elevational, view showing a second embodiment of a seal member according to the present invention.
Figure 6:
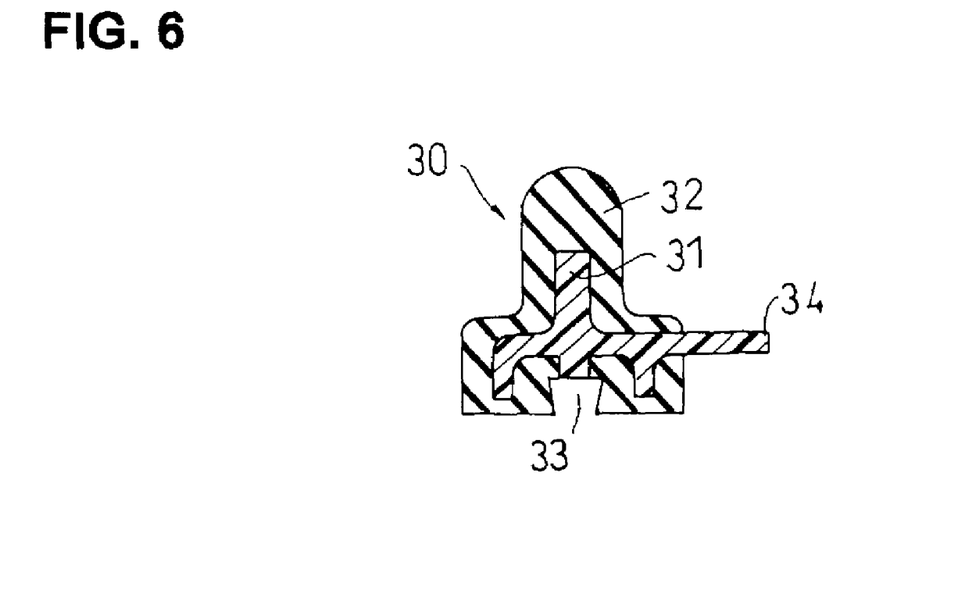
FIG. 6 is a side, elevational, sectional view of the seal member of FIG. 5 taken along line B—B.

In the seal member 30, the tabs 34 integrally provided on the base body section 31 formed of the thermoplastic resin which is rigid can be utilized as portions to be grasped or sucked during handling of the seal member, such as taking out the seal member during molding, subsequent storage thereof, attaching of it to the substrate storage container 20 or the like. In particular, the plurality of tabs 34 are disposed at corners of the seal member 30, in the middle of the four sides thereof and the like, as shown in FIG. 5, so that at the time the seal member 30 is attached to the substrate storage container 20, a force is transmitted to the other portions via the rigid base body section 31 by pushing the tabs 34 in, resulting in the entire area of the seal member 30 being readily engaged and held in place.

Figure 7:
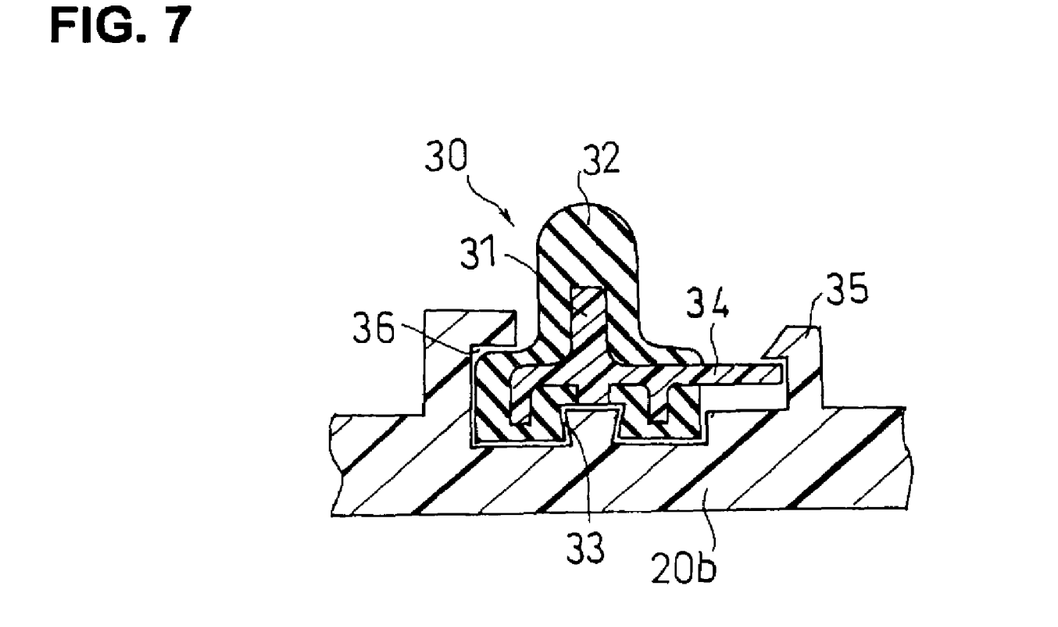
FIG. 7 is a side, elevational, sectional view showing a state of the seal member of FIG. 5 in use.
Figure 8:
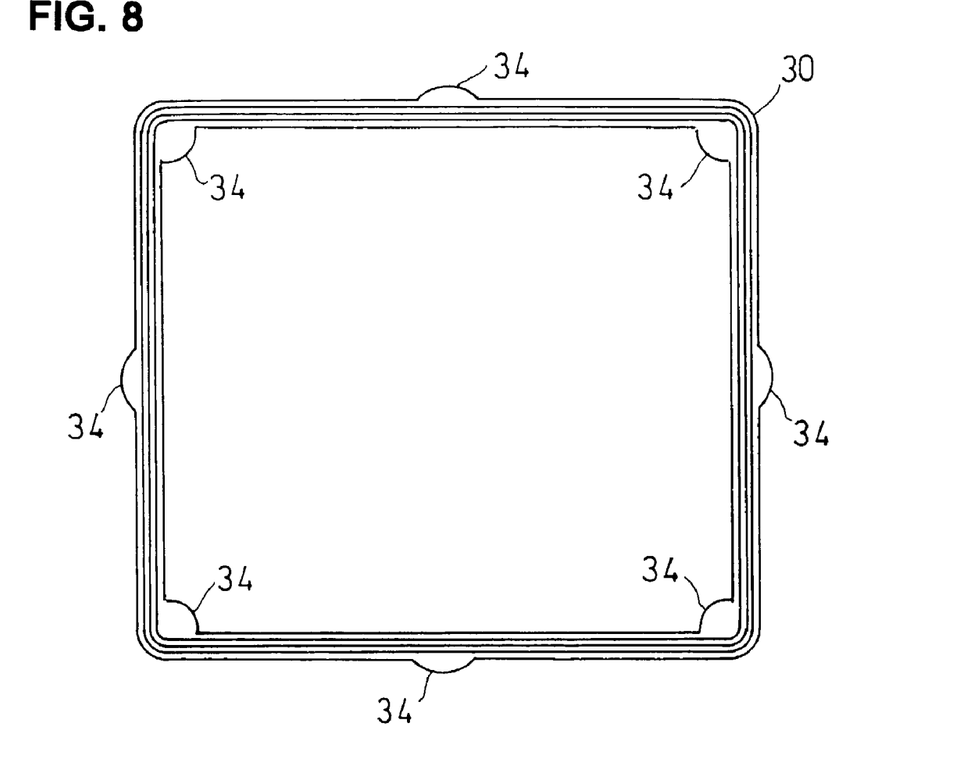
FIG. 8 is a top, elevational view showing a modification of the second embodiment of a seal member according to the present invention.
Figure 9:
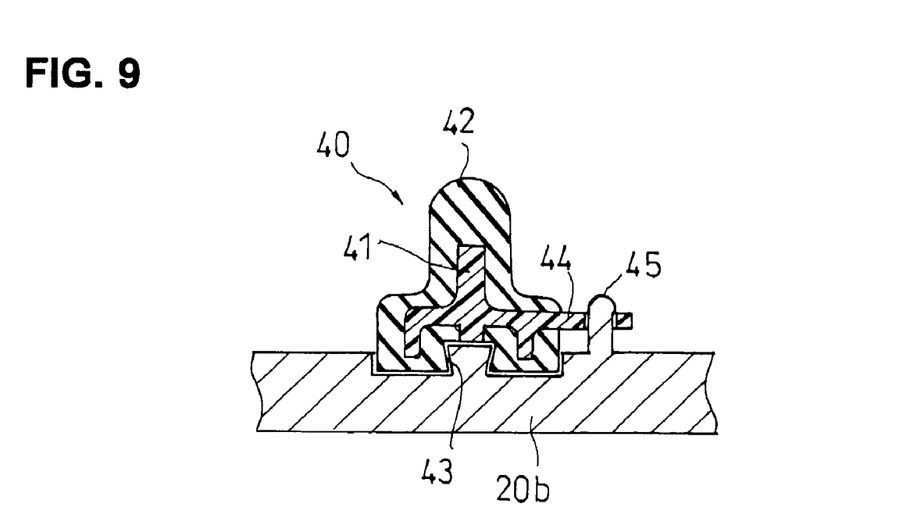
FIG. 9 is a side, elevational, sectional view showing another example of the state of the seal member of the second embodiment of the present invention in use.

In this case, an engaging means 35 for holding the tab 34 is provided on the cover 20b, as shown in FIG. 7, or a through hole or a notch is formed in a tab 44, as shown in FIG. 9 wherein another example of the seal member of the second embodiment of the present invention in use is illustrated, whereas an engaging means 45 such as a split pin, which fits in the hole or notch to hold the tab 44, is provided on the cover 20b, so that the seal member 30 or 40 can be positively prevented from being unsteadily lifted or spaced from the cover 20b. In the case of the tabs 34 or 44 being held in this manner, for example, in the embodiment shown in FIG. 5, the tabs 34 are arranged only on one side or the inner side of the seal member 30, but it is preferable that the tabs 34 or 44 be provided on the seal member 30 or 40 to be held in such a manner to be protruded alternately inwards and outwards, as shown in FIG. 8. In this instance, a seal member receiving groove 36 shown in FIG. 7 can be omitted, so that an attaching structure of the seal member 30 or 40 can be simplified. Reference numerals 33 and 43 denote engaging grooves in the drawings.

Figure 10:
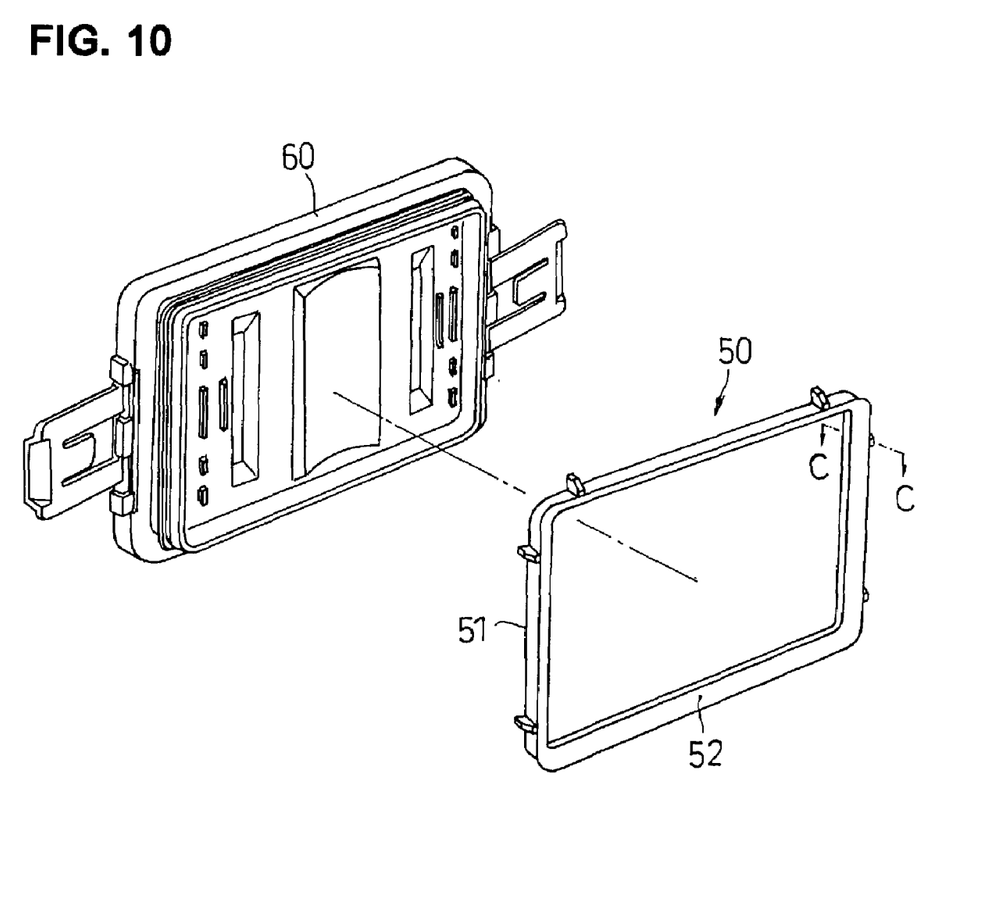
FIG. 10 is a side, perspective view showing a third embodiment of a seal member of the present invention.
Figure 11:
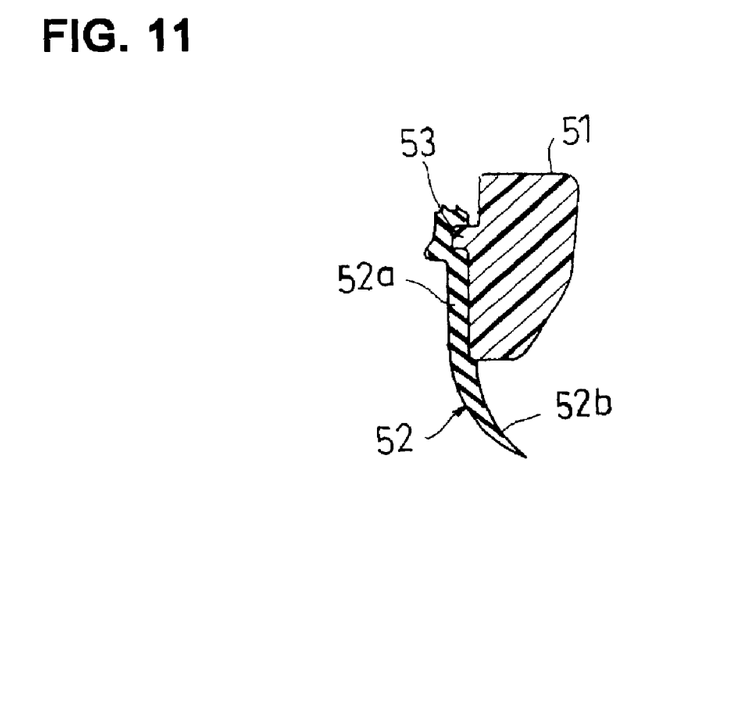
FIG. 11 is a side, elevational, sectional view taken along line C—C shown in FIG. 10.
Figure 12:
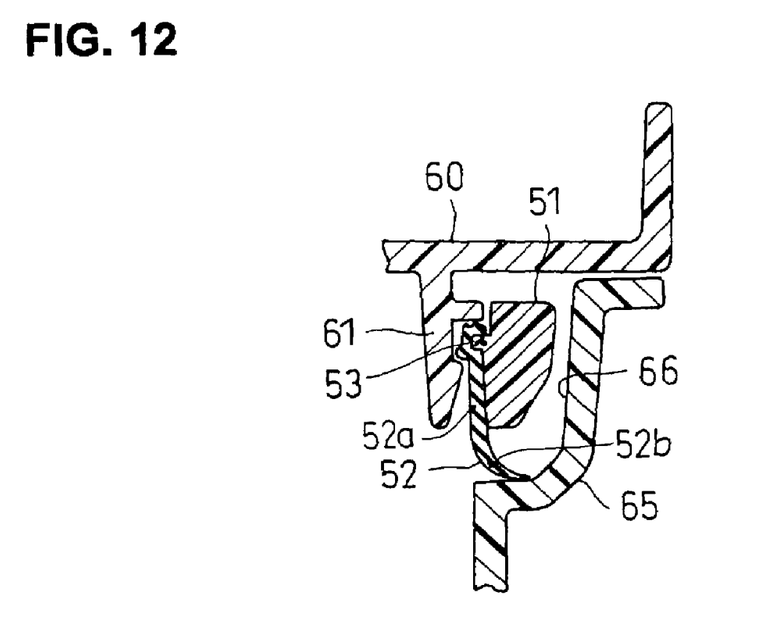
FIG. 12 is a side, elevational, sectional view showing a state of the seal member of FIG. 10 in use.

In the seal member 40 of the second embodiment, the base body section 44 and the covering section 42 are respectively formed of the first material and the second material described above. Next, a third embodiment of a seal member according to the present invention will be explained. As shown in FIGS. 10 to 12, a seal member 50 of the third embodiment of the present invention is constituted by a base body section 51 formed of the first material and a covering section 52 formed of the second material. The base body section 51 is formed to be a rectangular frame made of the first material which is like the material used for the base body section 11 of the seal member 10 in the above described embodiment, for example, a thermoplastic resin. An engaging protrusion 53 is formed on an inner peripheral side surface of the base body section 51 so as to be fitted in a fitting portion 61 formed on an inner surface of a cover 60.

The covering section 52 is formed of the second material which is like the material used for the covering section 12 of the seal member 10 in the above described embodiment, for example, a thermoplastic elastomer. The covering section 52 covers a portion of the base body section 51 including the engaging protrusion 53 provided on the inner periphery of the base body section 51 and is fixed or securely mounted to the inner peripheral side surface of the base body section 51.

Like the engaging protrusion 53 which is fitted in the fitting portion 61, it is preferable that portions of the base body section 51 other than the engaging protrusion 53 also be covered with a material similar to the covering section 52 such that the portions of the base body section 51 and the cover 60 do not come into direct contact with each other. Provision of such a covering can prevent portions which are both formed of the thermoplastic resin, such as the base body section 51 and the cover 60, from coming into contact with each other, so that the substrates stored in the substrate storage container can be prevented from being contaminated by powder generated due to rubbing or frictional wear of the thermoplastic resins, which is preferable.

As shown in FIG. 11, the covering section 52 comprises a base portion 52a fixed to the base body section 51 and a projecting portion 52b extending downwards from the base portion 52a in FIG. 11. The projecting portion 52b is formed to become gradually thinner towards a tip end thereof in FIG. 11. Also, the projecting portion 52b is formed so as to extend in a curved manner or in a linear manner obliquely, and the projecting portion 52b pressingly comes in contact with an opening portion of a container body 65 with an appropriate force, as shown in FIG. 12, to thereby hermetically seal the opening portion of the container body 65.

The projecting portion 52b may be formed to have various shapes other than that described above, for example, the projecting portion 52b may be formed to have an I-shape such that a distal end thereof is located on an extension line of the base portion 52a in FIG. 12, or the projecting portion 52b may be formed to have an L-shape such that it comes in contact with a side wall 66 of the opening portion of the container body 65. Also, a place where the covering section 52 is disposed is not limited to the inner periphery of the base body section 51. Instead, it may be located at an outer periphery or the other portion, as required. According to the present invention, a seal member is rigid and is hard to deform, so that the seal member is easy to handle after being molded and easy to mount to a substrate storage container, and the seal member is not lifted during use to thereby prevent the seal member from being displaced. Such a seal member allows automatic mounting of the seal member to a substrate storage container using the same.

The invention claimed is:

1. A seal member to be interposed between an opening end portion of a substrate storage container and a cover, said container comprising a container body which includes said opening end portion on a front side thereof and which stores a substrate and said cover, said cover being provided with a fitting groove formed on an inner surface thereof;

said seal member comprising a base body section formed of a rigid thermoplastic resin material and a covering section formed of a flexible thermoplastic elastomer material;

said base body section including an engaging protrusion adapted to be fitted in said fitting groove of said cover;

said covering section being fixed to an inner periphery side surface of said base body section to cover said engaging protrusion of said base body section; and said covering section including a seal forming portion adapted to contact said opening end portion of said container body to form a seal, said seal forming portion being formed to become gradually thinner toward a tip end thereof and to extend obliquely.

2. A seal member according to claim 1, wherein said thermoplastic resin material comprises a thermoplastic resin selected from the group consisting of polycarbonate, polyethylene terephthalate and polybutylene terephthalate, and said thermoplastic elastomer material comprises a thermoplastic polyester elastomer.

3. A seal member according to claim 1, wherein said thermoplastic resin material comprises a thermoplastic resin selected from the group consisting of polypropylene and polyethylene, and said thermoplastic elastomer material comprises a thermoplastic polyolefine elastomer.

4. A substrate storage container comprising a container body which includes an opening end portion on a front side thereof and stores a substrate, a cover, and a seal member interposed between said opening end portion and said cover, said cover being provided with a fitting groove formed on an inner surface thereof;

said seal member comprising a base body section which is formed of a first rigid thermoplastic resin material and a covering section which is formed of a flexible thermoplastic elastomer material;

said base body section including an engaging protrusion adapted to be fitted in said fitting groove of said cover;

said covering section being fixed to an inner periphery side surface of said base body section to cover said engaging protrusion of said base body section; and said covering section including a seal forming portion which comes in contact with said opening end portion of said container body to form a seal, said seal forming portion being formed to become gradually thinner toward a tip end thereof and to extend obliquely.

5. A substrate storage container according to claim 4, wherein said thermoplastic resin material comprises a thermoplastic resin selected from the group consisting of polycarbonate, polyethylene terephthalate and polybutylene terephthalate, and said thermoplastic elastomer material comprises a thermoplastic polyester elastomer.

6. A substrate storage container according to claim 4, wherein said thermoplastic resin material comprises a thermoplastic resin selected from the group consisting of polypropylene and polyethylene, and said thermoplastic elastomer material comprises a thermoplastic polyolefine elastomer.

* * * * *